United States Patent
Kato et al.

(10) Patent No.: US 8,823,130 B2
(45) Date of Patent: Sep. 2, 2014

(54) SILICON EPITAXIAL WAFER, METHOD FOR MANUFACTURING THE SAME, BONDED SOI WAFER AND METHOD FOR MANUFACTURING THE SAME

(75) Inventors: Masahiro Kato, Annaka (JP); Satoshi Oka, Annaka (JP); Norihiro Kobayashi, Annaka (JP); Tohru Ishizuka, Annaka (JP); Nobuhiko Noto, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 13/582,614

(22) PCT Filed: Mar. 1, 2011

(86) PCT No.: PCT/JP2011/001175
§ 371 (c)(1),
(2), (4) Date: Sep. 4, 2012

(87) PCT Pub. No.: WO2011/125282
PCT Pub. Date: Oct. 13, 2011

(65) Prior Publication Data
US 2012/0326268 A1    Dec. 27, 2012

(30) Foreign Application Priority Data

Apr. 1, 2010   (JP) ................. 2010-085381

(51) Int. Cl.
*H01L 21/70*   (2006.01)
*H01L 21/02*   (2006.01)
*H01L 21/762*  (2006.01)
*H01L 29/786*  (2006.01)

(52) U.S. Cl.
CPC .... *H01L 21/02381* (2013.01); *H01L 21/02532* (2013.01); *H01L 21/02576* (2013.01); *H01L 21/76254* (2013.01); *H01L 21/02433* (2013.01); *H01L 29/78603* (2013.01)
USPC ........... 257/506; 257/264; 257/272; 257/285; 257/325

(58) Field of Classification Search
None
See application file for complete search history.

(56) References Cited

U.S. PATENT DOCUMENTS

2005/0032331 A1   2/2005   Nakano
2006/0281283 A1  12/2006   Yoshida et al.

FOREIGN PATENT DOCUMENTS

JP         06338464 A   * 12/1994
JP         A-06-338464    12/1994

(Continued)

OTHER PUBLICATIONS

Nov. 13, 2012 International Preliminary Report on Patentability issued in International Patent Application No. PCT/JP2011/001175.

(Continued)

*Primary Examiner* — Kyoung Lee
(74) *Attorney, Agent, or Firm* — Oliff PLC

(57) ABSTRACT

A silicon epitaxial wafer having a silicon epitaxial layer grown by vapor phase epitaxy on a main surface of a silicon single crystal substrate, wherein the main surface of the silicon single crystal substrate is tilted with respect to a [100] axis at an angle θ in a [011] direction or a [0-1-1] direction from a (100) plane and at an angle φ in a [01-1] direction or a [0-11] direction from the (100) plane, the angle θ and the angle φ are less than ten minutes, and a dopant concentration of the silicon epitaxial layer is equal to or more than $1 \times 10^{19}$/cm$^3$. Even when an epitaxial layer having a dopant concentration of $1 \times 10^{19}$/cm$^3$ or more is formed on the main surface of the silicon single crystal substrate, stripe-shaped surface irregularities on the epitaxial layer are inhibited.

8 Claims, 5 Drawing Sheets

(56) References Cited

FOREIGN PATENT DOCUMENTS

| | | | |
|---|---|---|---|
| JP | A-2000-260711 | | 9/2000 |
| JP | 2003204048 A | * | 7/2003 |
| JP | A-2003-204048 | | 7/2003 |
| JP | A-2004-339003 | | 12/2004 |
| JP | 2008171958 A | * | 7/2008 |
| JP | A-2008-171958 | | 7/2008 |

OTHER PUBLICATIONS

May 31, 2011 International Search Report issued in International Patent Application No. PCT/JP2011/001175.

Japanese Office Action issued in Japanese Patent Application No. 2010-085381 dated Jul. 23, 2013 (w/ partial translation).

* cited by examiner

FIG. 1
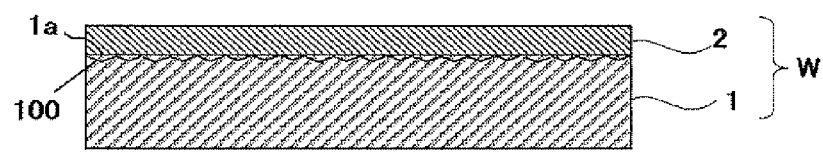
FIG. 2
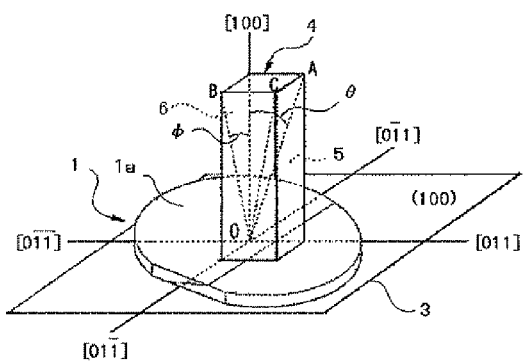
FIG. 3
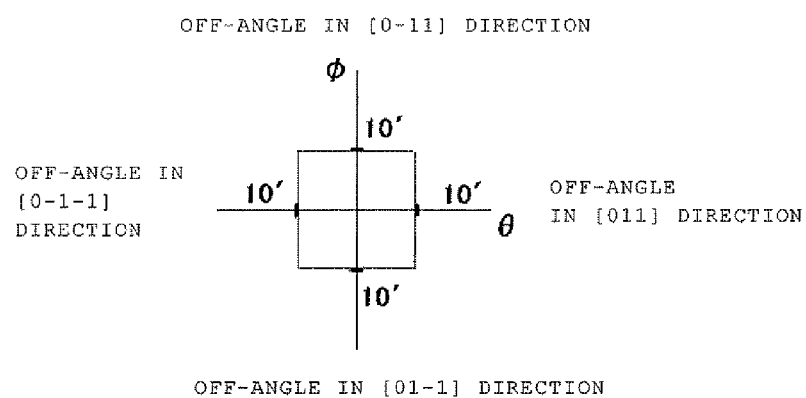
FIG. 4

SILICON EPITAXIAL WAFER, METHOD FOR MANUFACTURING THE SAME, BONDED SOI WAFER AND METHOD FOR MANUFACTURING THE SAME

TECHNICAL FIELD

The present invention relates to a silicon epitaxial wafer having a silicon epitaxial layer formed on a main surface of a silicon single crystal substrate and a method for manufacturing the silicon epitaxial wafer. The present invention also relates to a bonded SOI wafer and a method for manufacturing the bonded SOI wafer.

BACKGROUND ART

Silicon single crystal substrates for use in semiconductor substrates are manufactured by performing processes including slicing, chamfering, lapping, etching, and mirror-polishing on silicon single crystal ingots pulled, for example, by the CZ (Czochralski) method.

A method for growing a silicon epitaxial layer by vapor phase epitaxy is also used to improve crystal quality at a surface portion of the silicon single crystal substrate. In this method, the silicon epitaxial layer is grown by supplying silicon raw material to a main surface of the silicon single crystal substrate under a high temperature condition.

It is known that the method for manufacturing a silicon epitaxial wafer (hereinafter, also referred to as an epitaxial wafer alone) may produce surface irregularities according to conditions, thereby deteriorating device characteristics.

For example, Patent Document 1 proposes a method for preventing the surface irregularities, in which crystallographic step density of a main surface of the silicon single crystal substrate on which the epitaxial layer is grown is controlled to be equal to or less than approximately $10^{10}$ number/cm$^2$.

Patent Document 2 proposes a method of regulating the angle range of a crystal axis with respect to the surface of the silicon single crystal substrate to reduce irregularities referred to as "haze".

Patent Document 3 proposes a method of growing a silicon epitaxial layer on a silicon single crystal substrate having defects referred to as COP (Crystal Originated Particle) while regulating the angle range of a crystal axis with respect to the surface of the silicon single crystal substrate to prevent irregularities referred to as "teardrop".

In the vapor phase epitaxy method for growing the silicon epitaxial layer on the silicon single crystal substrate, there is a problem in that doping with dopant at high concentrations in the epitaxial layer growth causes formation of stripe-shaped steps on the epitaxial layer surface, thereby deteriorating its surface shape.

CITATION LIST

Patent Literature

Patent Document 1: Japanese Unexamined Patent publication (Kokai) No. H6-338464
Patent Document 2: Japanese Unexamined Patent publication (Kokai) No. 2000-260711
Patent Document 3: Japanese Unexamined Patent publication (Kokai) No. 2004-339003

SUMMARY OF INVENTION

As described above, there is the problem of forming stripe-shaped steps, caused by doping at high dopant concentrations, on the epitaxial layer surface to deteriorate its surface shape when the epitaxial layer is grown on the main surface of the silicon single crystal substrate.

None of the above documents, however, describes inhibiting the irregularities produced when the epitaxial layer is grown with doping at high dopant concentrations. The presence of the irregularities has an adverse effect on device characteristics. When a wafer referred to as an SOI (Silicon on Insulator) wafer is manufactured by bonding silicon epitaxial wafers having the irregularities together, there arises a problem in that adhesiveness at a bonding interface deteriorates and defects thereby occur.

The present invention was accomplished in view of the above-described problems, and its object is to provide a silicon epitaxial wafer in which, even when an epitaxial layer having a high dopant concentration of $1\times10^{19}$/cm$^3$ or more is formed on the main surface of the silicon single crystal substrate, the stripe-shaped surface irregularities on the epitaxial layer are inhibited. The object is also to provide a method for manufacturing the silicon epitaxial wafer, a bonded SOI wafer with the silicon epitaxial wafer, and a method for manufacturing the bonded SOI wafer.

To achieve this object, the present invention provides a silicon epitaxial wafer having a silicon epitaxial layer grown by vapor phase epitaxy on a main surface of a silicon single crystal substrate, wherein the main surface of the silicon single crystal substrate is tilted with respect to a [100] axis at an angle θ in a [011] direction or a [0-1-1] direction from a (100) plane and at an angle φ in a [01-1] direction or a [0-11] direction from the (100) plane, the angle θ and the angle φ are less than ten minutes, and a dopant concentration of the silicon epitaxial layer is equal to or more than $1\times10^{19}$/cm$^3$.

By adjusting the main surface of silicon single crystal substrate such that it is tilted at a prescribed angle substantially in a specific direction only from a (100) plane (i.e., with respect to a [100] axis at an angle θ in a [011] direction or a [0-1-1] direction from a (100) plane and at an angle φ in a [01-1] direction or a [0-11] direction from the (100) plane, and the angle θ and the angle φ are less than ten minutes), the stripe-shaped surface irregularities on the epitaxial layer can be inhibited in the silicon epitaxial wafer even when the epitaxial layer having a high dopant concentration of $1\times10^{19}$/cm$^3$ or more is formed on the silicon single crystal substrate.

In the silicon epitaxial wafer, the dopant can be phosphorus.

Furthermore, the present invention provides a method for manufacturing a silicon epitaxial wafer including the step of growing a silicon epitaxial layer by vapor phase epitaxy on a main surface of a silicon single crystal substrate, the method comprising growing the epitaxial layer by vapor phase epitaxy on the main surface of the silicon single crystal substrate such that the epitaxial layer has a dopant concentration of $1\times10^{19}$/cm$^3$ or more, wherein the main surface of the silicon single crystal substrate is tilted with respect to a [100] axis at an angle θ in a [011] direction or a [0-1-1] direction from a (100) plane and at an angle in a [01-1] direction or a [0-11] direction from the (100) plane, and the angle θ and the angle φ are less than ten minutes.

With the method for manufacturing a silicon epitaxial wafer of the present invention, the silicon epitaxial wafer in which the stripe-shaped surface irregularities on the epitaxial layer are inhibited can be manufactured even when being doped with dopant at high concentrations.

In this method, the dopant can be phosphorus.

Furthermore, the present invention provides a method for manufacturing a bonded SOI wafer by bonding a bond wafer and a base wafer together, the method comprising manufacturing the bonded SOI wafer by using the silicon epitaxial wafer manufactured by the above-described method as the bond wafer and/or the base wafer.

By using the silicon epitaxial wafer manufactured by the above-described method as the bond wafer, a bonded SOI wafer having a high dopant concentration (a dopant concentration of $1\times10^{19}/cm^3$ or more) SOI layer can be manufactured. By using the silicon epitaxial wafer manufactured by the above-described method as the base wafer, a bonded SOI wafer having a high dopant concentration layer (an epitaxial layer) just below an insulator film (a buried oxide film) can be manufactured. Two silicon epitaxial wafers manufactured by the above-describe method can each be used as the bond wafer and the base wafer.

Furthermore, the present invention provides a bonded SOI wafer having at least a buried oxide film formed on a base wafer and an SOI layer formed on the buried oxide film, wherein a dopant concentration of the SOI layer is equal to or more than $1\times10^{19}/cm^3$, the main surface of the SOT layer is tilted with respect to a axis at an angle θ in a [011] direction or a [0-1-1] direction from a (100) plane and at an angle φ in a [01-1] direction or a [0-11] direction from the (100) plane, and the angle θ and the angle φ are less than ten minutes.

This inventive bonded SOI wafer has an SOT layer of a high dopant concentration of $1\times10^{19}/cm^3$ or more, and also is a high quality wafer in which the adhesiveness at the bonding interface is improved and defects due to bonding failure are reduced.

In this method, the base wafer can be a silicon epitaxial wafer having a silicon epitaxial layer grown by vapor phase epitaxy on a silicon single crystal substrate, the silicon epitaxial layer having a dopant concentration of $1\times10^{19}/cm^3$ or more; and a main surface of the silicon epitaxial wafer can be tilted with respect to a [100] axis at an angle θ in a [011] direction or a [0-1-1] direction from a (100) plane and at an angle φ in a [01-1] direction or a [0-11] direction from the (100) plane, and the angle θ and the angle φ can be less than ten minutes.

Using the above silicon epitaxial wafer as the base wafer can ensure the bonded SOI wafer having the high dopant concentration layer (the epitaxial layer) just below the buried oxide film, and improved adhesiveness at the bonding interface of the bonded SOI wafer, thereby greatly reducing the defects of the bonded SOI wafer.

Furthermore, the present invention provides a bonded SOI wafer having at least a buried oxide film formed on a base wafer and an SOI layer formed on the buried oxide film, wherein the base wafer is a silicon epitaxial wafer having a silicon epitaxial layer grown by vapor phase epitaxy on a silicon single crystal substrate, the silicon epitaxial layer having a dopant concentration of $1\times10^{19}/cm^3$ or more; and a main surface of the silicon epitaxial wafer is tilted with respect to a [100] axis at an angle θ in a [011] direction or a [0-1-1] direction from a (100) plane and at an angle φ in a [01-1] direction or a [0-11] direction from the (100) plane, and the angle θ and the angle φ are less than ten minutes.

This inventive bonded SOI wafer has the high dopant concentration layer (the epitaxial layer) just below the buried oxide film, and also is a high quality wafer in which the adhesiveness at the bonding interface is improved and the defects due to bonding failure are reduced. In the bonded SOI wafer, the dopant can be phosphorus.

As described above, the present invention can provide the silicon epitaxial wafer having the epitaxial layer of a high dopant concentration of $1\times10^{19}/cm^3$ or more, formed on the main surface of the silicon single crystal substrate. In the silicon epitaxial wafer, the stripe-shaped surface irregularities on the epitaxial layer is inhibited. The present invention can also provide the method for manufacturing the silicon epitaxial wafer. The present invention can further provide the high quality bonded SOI wafer having the high dopant concentration (a dopant concentration of $1\times10^{19}/cm^3$ or more) SOI layer and having reduced defects, the bonded SOI wafer having the high dopant concentration layer (the epitaxial layer) just below the insulator film (the buried oxide film), and the method for manufacturing these wafers.

BRIEF DESCRIPTION OF DRAWINGS

FIG. 1(a) shows the notation denoting the [0-1-1] direction by the Miller indices, and FIG. 1(b) shows the notation denoting the [01-1] direction by the Miller indices, and FIG. 1(c) shows the notation denoting the [0-11] direction by the Miller indices;

FIG. 2 is a longitudinal sectional view showing the silicon epitaxial wafer of the present invention;

FIG. 3 is an explanatory diagram of a tilt angle (off-angle) of the main surface of a silicon single crystal substrate;

FIG. 4 is diagram of the tilt range of the main surface of a silicon single crystal substrate;

DESCRIPTION OF EMBODIMENTS

Figure 5:
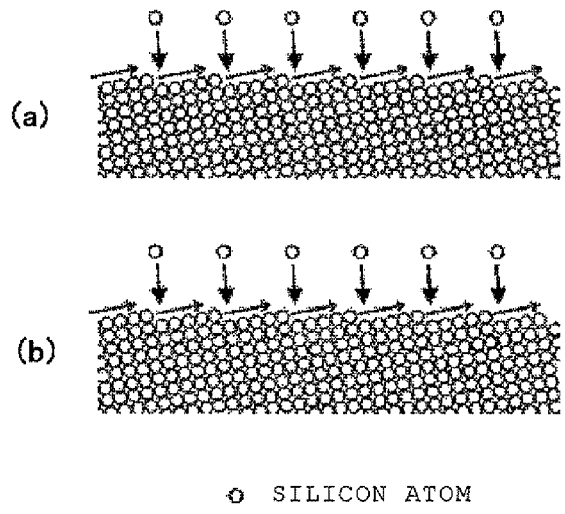
FIG. 5 is an explanatory diagram of silicon epitaxial growth when the dopant concentration is low.

The present invention will be described below in detail.

As described above, the silicon epitaxial wafer having the silicon epitaxial layer grown by vapor phase epitaxy on the main surface of the silicon single crystal substrate conventionally has the problem of producing the stripe-shaped surface irregularities when being doped with dopant at high concentrations in the epitaxial layer growth.

The present inventors conducted studies, thereby finding the following. In the silicon epitaxial wafer having the silicon epitaxial layer grown by vapor phase epitaxy on the main surface of the silicon single crystal substrate, the main surface of the silicon single crystal substrate is adjusted to be tilted at a prescribed angle substantially in a specific direction only from the (100) plane. This adjustment enables the surface irregularities of the epitaxial layer to be inhibited even when the epitaxial layer is formed on the main surface of the silicon single crystal substrate such that its dopant concentration becomes equal to or more than $1\times10^{19}/cm^3$.

Specifically, the silicon epitaxial wafer of the present invention has a silicon epitaxial layer grown by vapor phase epitaxy on a main surface of a silicon single crystal substrate and is characterized in that the main surface of the silicon single crystal substrate is tilted with respect to a [100] axis at an angle θ in a [011] direction or a [0-1-1] direction from a (100) plane and at an angle φ in a [01-1] direction or a [0-11] direction from the (100) plane, the angle θ and the angle φ are less than ten minutes, and a dopant concentration of the silicon epitaxial layer is equal to or more than $1\times10^{19}/cm^3$.

Here, the [0-1-1] direction, the [01-1] direction and the [0-11] direction denote the direction in FIG. 1(a), the direction in FIG. 1(b), and the direction in FIG. 1(c), respectively.

According to the present invention, the main surface of the silicon single crystal substrate is tilted at an off-angle θ in the [011] direction or the [0-1-1] direction from the (100) plane with respect to the [100] axis. The main surface is also tilted at an off-angle φ in the [01-1] direction or the [0-11] direction from the (100) plane with respect to the [100] axis. The off-angle θ and off-angle φ are both adjusted to be less than 10 minutes. The surface irregularities of the epitaxial layer can thereby be inhibited greatly even when the silicon epitaxial layer is grown by vapor phase epitaxy on the main surface of the silicon single crystal substrate such that the dopant concentration of the silicon epitaxial layer becomes equal to or more than $1\times10^{19}/cm^3$.

FIG. 2 is a longitudinal sectional view showing the silicon epitaxial wafer of the present invention. As shown in FIG. 2, the silicon epitaxial wafer W includes the silicon single crystal substrate 1 on which the silicon epitaxial layer 2 having a dopant concentration of $1\times10^{19}/cm^3$ is grown by vapor phase epitaxy on the main surface 1a.

The main surface 1a of the silicon single crystal substrate 1 is adjusted to be tilted at a prescribed angle (off-angle) substantially in a specific direction only from the (100) plane. The off-angle of the main surface 1a of the silicon single crystal substrate 1 will now be described with reference to FIG. 3.

In FIG. 3, one point in the (100) plane 3 is represented by the point O. Crystal axes [011], [0-1-1], [01-1], and [0-11] passing through the point O are given in the (100) plane 3. Cuboid 4 is disposed on the (100) plane 3. More specifically, one of vertexes of the cuboid 4 is located at the point O. The cuboid 4 is disposed in such a manner that three sides contacting the vertex located at the point O are each aligned with the [011] axis, the [01-1] axis, and the [100] axis.

In FIG. 3, the tilt angle (off-angle) between the [100] axis and the diagonal OA of the side surface 5 of the cuboid 4 is represented by an angle θ, and the tilt angle between the [100] axis and the diagonal OB of the side surface 6 of the cuboid 4 is represented by an angle φ. The diagonal OC of the cuboid 4 is the normal to the silicon single crystal substrate 1. The main surface 1a of the silicon single crystal substrate 1 is tilted with respect to the [100] axis at the angle θ in the [011] direction from the (100) plane and at the angle φ in the [01-1] direction from the (100) plane. As shown in FIG. 4, the angle θ and the angle φ are both less than 10 minutes.

As the tilt angles φ and θ of the main surface with respect to the [100] axis of the silicon single crystal substrate becomes larger, crystallographic atomic steps are formed on the main surface of the silicon single crystal substrate. Silicon epitaxial growth states on the main surface when the steps are formed will be described with reference to figures.

In normal epitaxial growth with a low concentration of dopant such as phosphorus, as shown in FIG. 5(a), silicon atoms stick on the positions of the steps so that silicon atom layers are accumulated. In this case, as shown in FIG. 5(b), the height of the steps is kept to that of an atom and therefore does not become extremely large, as the accumulation proceeds.

Figure 6:
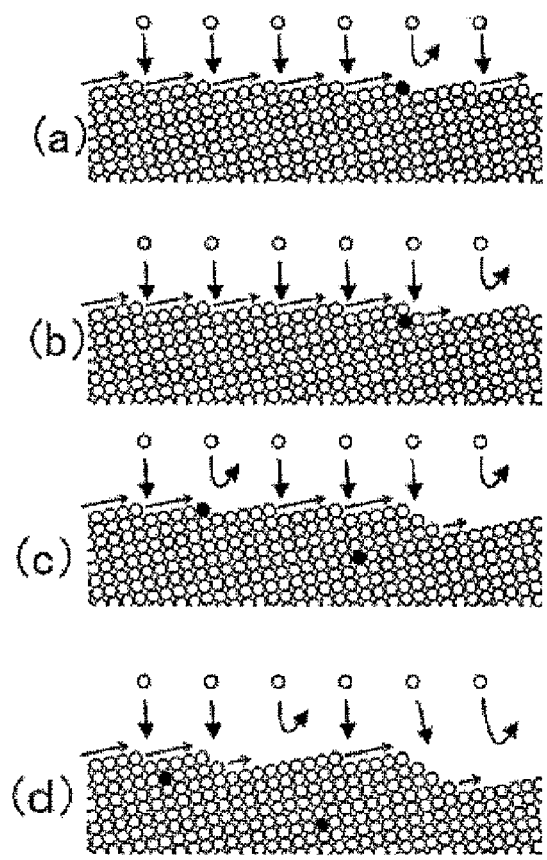
FIG. 6 is an explanatory diagram of silicon epitaxial growth when the dopant concentration is high.

On the other hand, the epitaxial growth in conditions where the concentration of the dopant in the epitaxial layer becomes equal to or more than $1\times10^{19}/cm^3$ will be described below with reference to FIG. 6, by way of example of phosphorus dopant. In the case of a high phosphorus concentration of $1\times10^{19}/cm^3$ or more, as shown in FIG. 6(a), the probability that a phosphorus atom sticks to the position of the step increases. As shown in FIG. 6(b), at the position of the phosphorus atom, sticking silicon is hampered and thereby the epitaxial growth is temporarily retarded. When step density is high, a next step is being formed on the position of the phosphorus atom during the retardation, so that a step of two accumulated atoms is formed. For the epitaxial growth, the step of two accumulated atoms requires twice as many silicon atoms as a step of one accumulated atom, thereby retarding step growth movement. As shown in FIG. 6(c), once such an abnormal step is formed, next steps of one accumulated atom is formed on the abnormal step one after another and its height becomes larger. When this phenomenon occurs at some positions, as shown in FIG. 6(d), the surface irregularities are formed on the main surface. The formation of surface irregularities may also be produced in the case of dopants other than phosphorus (e.g., antimony, arsenic, and boron).

Figure 7:
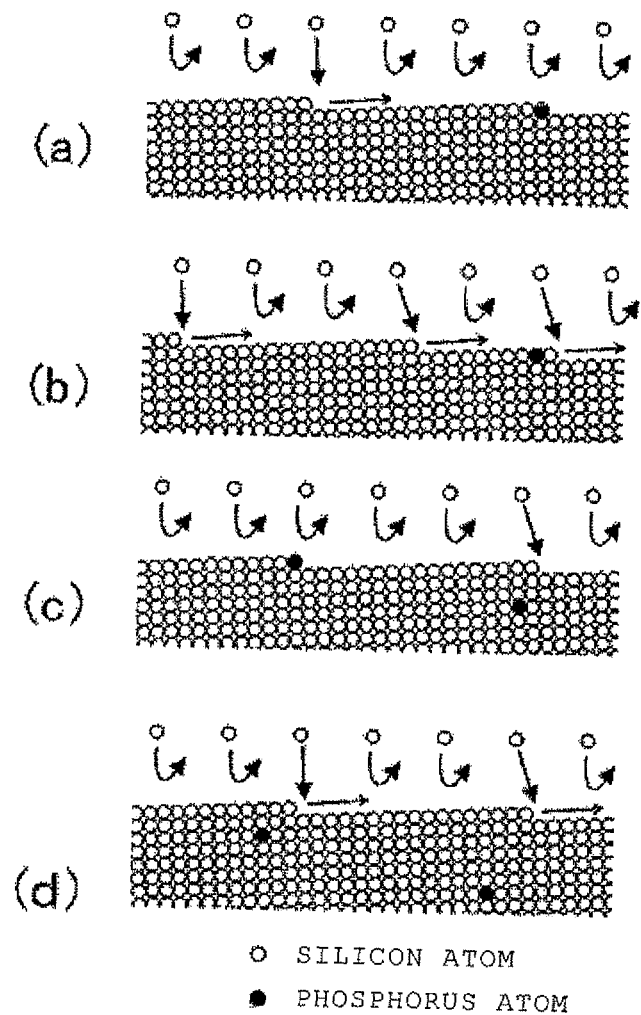
FIG. 7 is an explanatory diagram of epitaxial growth in the silicon epitaxial wafer of the present invention.

In the present invention, the tilt angles φ and θ are set to less than 10 minutes to reduce the density of crystallographic atomic steps on the main surface of the silicon single crystal substrate on which the epitaxial layer is grown. This effect will be described with reference to FIG. 7. When the growth of steps is temporarily retarded due to the phosphorus atom as shown in FIG. 7(a), a low step density increases the probability that the growth of silicon is resumed before the next atomic step arrives as shown in FIG. 7(b). In this case, a distance between the atomic steps varies to some extent. However, as shown in FIGS. 7(c) and 7(d), the atomic steps of one accumulated atom remain. The surface irregularities of the main surface of the silicon epitaxial wafer can be therefore reduced even when the epitaxial layer is grown with doping at high dopant concentrations.

Next, the inventive method for manufacturing the silicon epitaxial wafer W shown in FIG. 2 will be described.

First, a silicon single crystal ingot (not shown) is manufactured by the CZ method. Next, the silicon single crystal ingot is cut into blocks, followed by slicing the blocks of the silicon single crystal ingot.

Here, the silicon single crystal ingot is sliced such that the main surface 1a of the silicon single crystal substrate 1 being produced is tilted with respect to the [100] axis at an angle θ in the [011] direction or the [0-1-1] direction from the (100) plane and at an angle φ in the [01-1] direction or the [0-11] direction from the (100) plane and the angle θ and the angle φ are less than ten minutes. Next, processes including chamfering, lapping, etching, mirror-polishing, and cleaning are performed on the surface of the sliced wafer to prepare the silicon single crystal substrate 1.

The silicon epitaxial layer 2 having a dopant concentration of $1\times10^{19}/cm^3$ or more is then grown by vapor phase epitaxy on the main surface 1a of the silicon single crystal substrate 1.

In the vapor phase epitaxy, a commonly used method can be used. In the present invention, a phosphine gas may be used as a dopant gas and dichlorosilane and monosilane gasses may be used as a material gas to grow the epitaxial layer 2 having a dopant concentration of $1\times10^{19}/cm^3$ or more. As the dopant, antimony, arsenic, and boron can also be used other than phosphorus.

There has been the problem of producing the surface irregularities on the epitaxial layer doped with the dopant at high concentrations; however, the stripe-shaped surface irregularities on the silicon epitaxial layer 2 of the present invention is greatly inhibited.

The silicon epitaxial wafer W manufactured in this manner is used as the bond wafer and/or the base wafer to manufacture a bonded SOI wafer. This enables adhesiveness at a bonding interface to be increased, thereby reducing the defects in the bonded SOI wafer.

As a method for thinning one wafer after bonding two wafers together in a method for manufacturing a bonded wafer, a method of thinning it by grinding and polishing and an ion implantation delamination method (also referred to as the SMART-CUT (a registered trademark) method) have been commonly known. The silicon epitaxial wafer of the present invention can be used in both of the methods An example of the method for manufacturing a bonded SOI wafer of the present invention (using the SMART-CUT (a registered trademark) method) is shown in FIG. 8.

Figure 8:
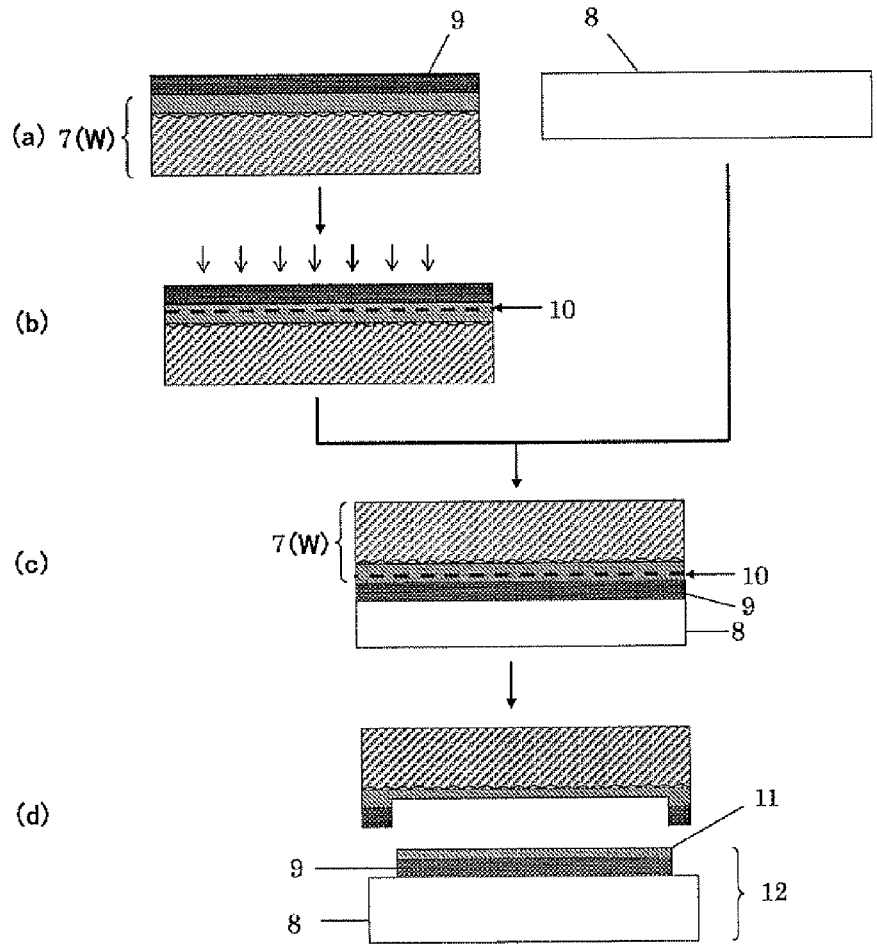
FIG. 8 is a flow chart showing an example of the method for manufacturing a bonded SOI wafer of the present invention.

First, in the step (a) in FIG. 8, the bond wafer 7 and the base wafer 8 are prepared. In the present invention, the above-described silicon epitaxial wafer W can be used as the bond wafer 7 and/or the base wafer 8. In the method for manufacturing a bonded SOI wafer shown in FIG. 8, the silicon epitaxial wafer W is used as the bond wafer 7.

Note that various wafers such as a polished wafer and a heat-treated wafer of silicon single crystal can be used when the silicon epitaxial wafer W is not used as either the bond wafer or the base wafer.

An insulator film 9 is formed in advance on both of the bond wafer 7 and the base wafer 8, or either of them. Alternatively, the wafers on which the insulator film is not formed may be used as the base and bond wafers. In FIG. 8(*a*), the insulator film 9 is formed on the bond wafer 7. For example, a thermal oxide film and a CVD oxide film can be formed as the insulator film 9.

Next, in the step (b), at least one of hydrogen ions and rare gas ions are implanted from the surface of the insulator film 9 on the bond wafer 7 to form an ion implanted layer 10 in the interior of the wafer (the epitaxial layer). Other ion-implanting conditions such as implantation energy, an implanting amount, and an implanting temperature may be appropriately selected to form an SOI layer having a predetermined thickness.

Next, in the step (c), the base wafer 8 is brought into close contact with the insulator film 9 on the bond wafer 7 to bond them together.

Next, in the step (d), the bond wafer 7 is delaminated at the ion implanted layer 10 by a delamination heat treatment to manufacture the bonded SOI wafer 12 having the SOI layer 11 formed on the base wafer 8 through the buried oxide film 9 (the insulator film).

The delamination heat treatment is not limited in particular. For example, the bond wafer 7 can be delaminated by a heat treatment in which the bonded wafer is heated up to temperatures from 500 to 600° C. under a nitrogen atmosphere.

For example, a bonding heat treatment is performed at 1000° C. or more under an oxidizing or non-oxidizing atmosphere on the bonded SOI wafer 12 manufactured in the above manner to enhance bonding strength at the bonding interface. The SOI layer is then thinned to a desired thickness by polishing or sacrificial oxidation treatment to complete a final bonded SOI wafer.

The bonded SOI wafer 12 can be manufactured by using the silicon epitaxial wafer W of the present invention as the bond wafer 7 in the above manner.

More Specifically, the present invention can provide the bonded SOI wafer 12 having at least the buried oxide film 9 formed on the base wafer 8 and the SOI layer 11 formed on the buried oxide film, in which the dopant concentration of the SOI layer 11 is equal to or more than $1\times10^{19}/cm^3$, the main surface of the SOI layer 11 is tilted with respect to the [100] axis at an angle θ in the [011] direction or the [0-1-1] direction from the (100) plane and at an angle φ in the [01-1] direction or the [0-11] direction from the (100) plane, and the angle θ and the angle φ are less than ten minutes. The bonded SOI wafer 12 is shown in FIG. 8(*d*).

Using the epitaxial wafer W having the epitaxial layer of a high dopant concentration of $1\times10^{19}/cm^3$ or more as the bond wafer 7 enables the SOI wafer 12 having the high dopant concentration SOI layer 11 to be provided. In such a bonded SOI wafer 12, the adhesiveness at its bonding interface is improved and the defects are reduced. This bonded SOI wafer 12 has thus high quality.

In the method for manufacturing a bonded SOI wafer of the present invention shown in FIG. 8, the inventive silicon epitaxial wafer W can also be used as the base wafer 8.

Figure 9:
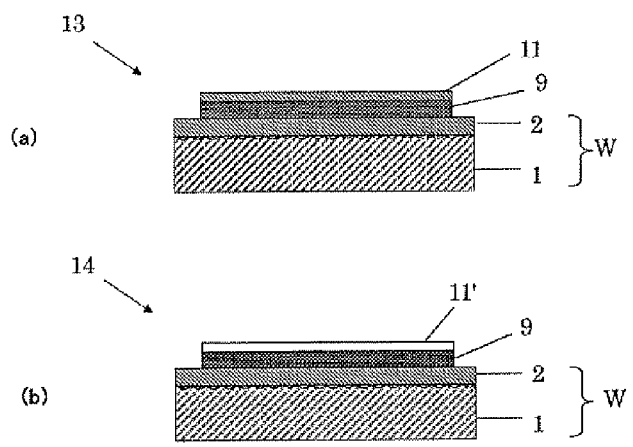
FIG. 9 is a diagram showing another example of a bonded SOI wafer of the present invention.

More Specifically, the present invention can manufacture the bonded SOI wafer 13 having the buried oxide film 9 formed on the silicon epitaxial wafer W and the SOI layer 11 formed on the buried oxide film, in which the silicon epitaxial wafer W has the silicon epitaxial layer 2, grown by vapor phase epitaxy on the silicon single crystal substrate 1, having a dopant concentration of $1\times10^{19}/cm^3$ or more, the main surface of the silicon epitaxial wafer W is tilted with respect to the [100] axis at an angle θ in the [011] direction or the [0-1-1] direction from the (100) plane and at an angle φ in the [01-1] direction or the [0-11] direction from the (100) plane, and the angle θ and the angle φ are less than ten minutes. The bonded SOI wafer 13 is shown in FIG. 9(*a*). As described above, the silicon epitaxial wafer W having a high dopant concentration epitaxial layer may be used as both of the bond wafer 7 and the base wafer 8.

The inventive epitaxial wafer W having a high dopant concentration epitaxial layer may also be used as the base wafer 8 only.

More specifically, the present invention can provide the bonded SOI wafer 14 including the buried oxide film 9 formed on the silicon epitaxial wafer W and the SOI layer 11' formed on the buried oxide film, in which the silicon epitaxial wafer W has the silicon epitaxial layer 2, grown by vapor phase epitaxy on the silicon single crystal substrate 1, having a dopant concentration of $1\times10^{19}/cm^3$ or more, the main surface of the silicon epitaxial wafer W is tilted with respect to the [100] axis at an angle θ in the [011] direction or the [0-1-1] direction from the (100) plane and at an angle φ in the [01-1] direction or the [0-11] direction from the (100) plane, and the angle θ and the angle φ are less than ten minutes. The bonded SOI wafer 14 is shown in FIG. 9(*b*). The bonded SOI wafer 14 that can be manufactured herein has the high dopant concentration epitaxial layer 2 just below the buried oxide film 9.

Whether the silicon epitaxial wafer of the present invention is used as both of the bond wafer and the base wafer or as either the bond wafer or the base wafer may be determined on the basis of specifications of a device being manufactured by using the bonded SOT wafer.

In the bonded SOI wafers 12, 13, and 14 of the present invention, the defects on the SOI surface due to the bonding failure are greatly reduced.

EXAMPLE

The present invention will be more specifically described below with respect to Examples and Comparative Examples, but the present invention is not limited these examples.

Example 1

A 3 μm epitaxial layer was grown on the main surface of each of silicon single crystal substrates (a diameter of 300 mm) by vapor phase epitaxy at a growth temperature of 1080° C. while a phosphine ($PH_3$) gas was introduced in conditions where the concentration of phosphorus in the epitaxial layer became $2\times10^{19}/cm^3$. The main surface of each of the silicon single crystal substrates was tilted with respect to the [100] axis at an angle θ in the [011] direction from the (100) plane and at an angle φ in the [01-1] direction from the (100) plane, where the angle θ satisfied 6' (0.1°)≤θ≤9' (0.15°) and the angle φ was 1 minute. The material gas used herein was dichlorosilane.

Comparative Example 1

A 3 μm epitaxial layer was grown on the main surface of each of silicon single crystal substrates (a diameter of 300 mm) by vapor phase epitaxy at a growth temperature of 1080° C. while a phosphine ($PH_3$) gas was introduced in conditions where the concentration of phosphorus in the epitaxial layer became $2\times10^{19}/cm^3$, where the angle θ satisfied 10'≤θ≤14' and the angle φ satisfied 1'≤θ≤5'. The material gas used herein was dichlorosilane.

Comparative Example 2

A 3 μm epitaxial layer was grown on the main surface of each of silicon single crystal substrates (a diameter of 300 mm) by vapor phase epitaxy at a growth temperature of 1080° C. while a phosphine ($PH_3$) gas was introduced in conditions where the concentration of phosphorus of the epitaxial layer became $5\times10^{18}/cm^3$, where the angle θ satisfied 10'≤θ≤14' and the angle φ satisfied 1'≤θ≤5'. The material gas used herein was dichlorosilane.

Figure 10:
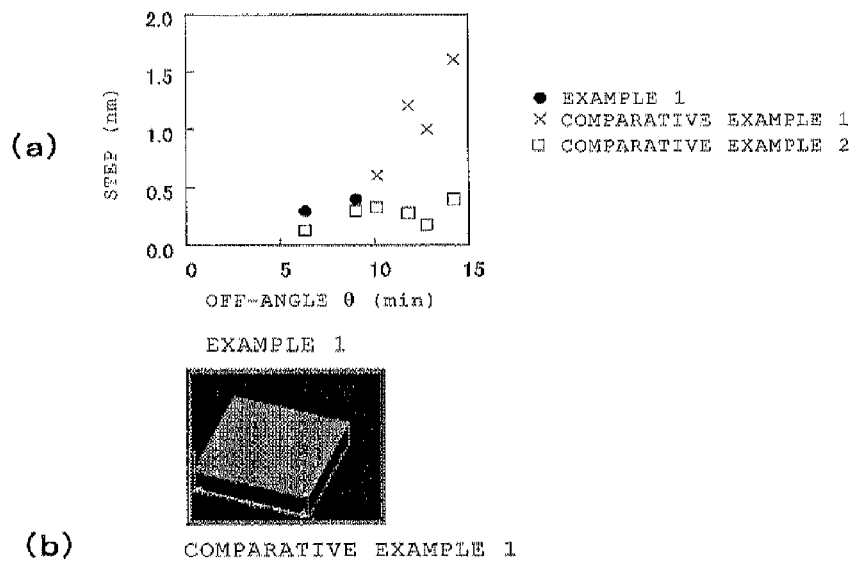
FIG. 10(a) is a comparative diagram of a step size on the surface of each of the silicon epitaxial wafers obtained in Example 1, Comparative Example 1, and Comparative Example 2.
FIG. 10(b) is an observation diagram obtained by an AFM apparatus, illustrating the surface of each of the epitaxial wafers obtained in Example 1 and Comparative Example 1.

A comparative diagram of a step size on the surface of each of the silicon epitaxial wafers obtained in Example 1, Comparative Example 1, and Comparative Example 2 is shown in FIG. 10(a). An AFM (Atomic Force Microscope) apparatus was used to measure the step size. A 30 μm square region was measured, and the step size was obtained by a P-V (Peak to Valley) value in the region. An observation diagram, obtained by the AFM apparatus, illustrating the surface of each of epitaxial wafers obtained in Example 1 and Comparative Example 1 is shown in FIG. 10(b).

In the epitaxial wafers obtained in Comparative Example 1, a step having a size of more than 0.5 nm was formed and the size tended to be increased with the off-angle θ. In the wafers obtained in Example 1, on the other hand, the size of all steps was limited to less than 0.5 nm. It was accordingly confirmed that an angle θ of less than 10 minutes enables the step on the wafer surface to be limited to less than 0.5 nm in size. Note that a step size of 0.5 nm is substantially equal to the lower limit measurable by the AFM apparatus, and a step of less than 0.5 nm in size can be judged to be slight.

In Example 1 and Comparative Example 1, the angle φ was fixed to a value not more than 5 minutes while the angle θ was changed. Since there is a crystallographically equivalence relation between the angles θ and φ, it appears that angular dependence by the angle φ is identical to that by the angle θ.

In Comparative Example 2, the size of all steps was limited to less than 0.5 nm without being affected by the angle θ, even though the angle θ was changed in the same manner as Comparative Example 1. It can be considered that, since the dopant concentration was low in Comparative Example 2, no large step was formed even when the angle θ was large.

Moreover, silicon epitaxial wafers were manufactured in the same conditions as Example 1 except that the concentration of phosphorus in the epitaxial layer was changed to $1\times10^{19}/cm^3$, $3\times10^{19}/cm^3$, and $5\times10^{19}/cm^3$. The size of steps on the surface of the manufactured wafers was measured. As a result, in all wafers, the size of steps was limited to less than 0.5 nm. It can be accordingly said that the present invention is effective when the concentration of phosphorus in the epitaxial layer was equal to or more than $1\times10^{19}/cm^3$.

Next, the effects achieved when the above silicon epitaxial wafers obtained were used to manufacture the bonded SOI wafers will be described with reference to the following Example and Comparative Example.

Example 2

The epitaxial wafer obtained in Example 1 was used as the bond wafer (the wafer for forming the SOI layer) to manufacture the bonded SOI wafer according to the method for manufacturing a bonded SOI wafer (using the ion implantation delamination method) shown in FIG. 8. The manufacture conditions will be described below.
(BOND WAFER): The epitaxial wafer manufactured in Example 1.
(BASE WAFER): A silicon single crystal substrate; a diameter of 300 mm; p-type, (100); 10 Ωcm.
(FORMATION OF OXIDE FILM): A 150 nm thermal oxide film formed on the surface of the bond wafer.
(ION IMPLANTATION): Hydrogen ions implanted through the oxide film on the surface of the bond wafer; 50 keV; $6\times10^{16}/cm^2$.
(DELAMINATION HEAT TREATMENT): 500° C.; 30 minutes.

The bonding heat treatment was performed on the SOI wafer after delamination under an oxidizing atmosphere. After removing the oxide film from the surface, a flattening heat treatment was performed at 1200° C. under an Ar atmosphere for one hour. The sacrificial oxidation treatment was then performed such that the final thickness of the SOI layer became 100 nm. The SOI surface was then observed with a surface defect inspection apparatus, SP2 (made by KLA-Tencor Co., Ltd.), to count the number of defects each having a size of 0.5 μm or more, which were regarded as the defects due to the bonding failure.

Comparative Example 3

The epitaxial wafer having the steps obtained in Comparative Example 1 was used as the bond wafer (the wafer for forming the SOI layer) to manufacture the bonded SOT wafer by the ion implantation delamination method in the same conditions as Example 2. The defects on its surface was then observed.

Figure 11:
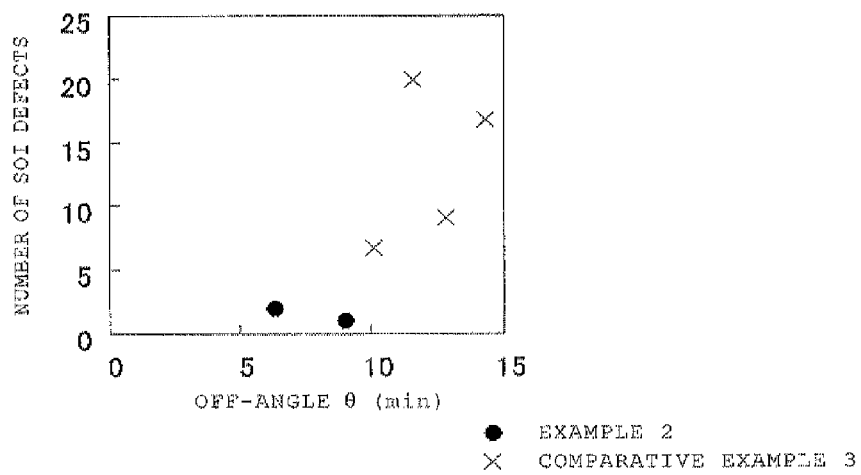
FIG. 11 is a comparative diagram of the number of defects due to the bonding failure on the SOI wafers obtained in Example 2 and Comparative Example 3.

A graph for comparing the number of defects due to the bonding failure on the SOI wafers obtained in Example 2 and Comparative Example 3 is shown in FIG. 11. In the SOI wafer in Comparative Example 3, the surface irregularities of the epitaxial wafer used as a material caused a lot of defects due to the bonding failure on the SOI surface. In Example 2, on the other hand, the defects was reduced more than Comparative Example 3.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

For example, the present invention recites "a (100) plane" as the main surface of the silicon single crystal substrate and "a [011] direction or a [0-1-1] direction" and "a [01-1] direction or a [0-11] direction" as the tilt direction from the main surface. Any main surfaces and tilt directions equivalent to them are included in the technical scope of the present invention and exert the effects of the present invention.

The invention claimed is:

1. A method for manufacturing a bonded SOI wafer by bonding a bond wafer and a base wafer together, the method comprising manufacturing the bonded SOI wafer by using a silicon epitaxial wafer as the bond wafer and/or the base wafer, wherein the silicon epitaxial layer is manufactured by a method comprising:

growing the epitaxial layer by vapor phase epitaxy on a main surface of a silicon single crystal substrate such that the epitaxial layer has a dopant concentration of $1\times10^{19}/cm^3$ or more, wherein the main surface of the silicon single crystal substrate is tilted with respect to a [100] axis at an angle θ in a [011] direction or a [0-1-1] direction from a (100) plane and at an angle φ in a [01-1] direction or a [0-11] direction from the (100) plane, and the angle θ and the angle φ are less than ten minutes.

2. The method for manufacturing a silicon epitaxial wafer according to claim 1, wherein the dopant is phosphorus.

3. A bonded SOT wafer having at least a buried oxide film formed on a base wafer and an SOT layer formed on the buried oxide film, wherein a dopant concentration of the SOI layer is equal to or more than $1\times10^{19}/cm^3$, the main surface of the SOT layer is tilted with respect to a [100] axis at an angle θ in a [011] direction or a [0-1-1] direction from a (100) plane and at an angle φ in a [01-1] direction or a [0-11] direction from the (100) plane, and the angle θ and the angle φ are less than ten minutes.

4. The bonded SOI wafer according to claim 3, wherein the base wafer is a silicon epitaxial wafer having a silicon epitaxial layer grown by vapor phase epitaxy on a silicon single crystal substrate, the silicon epitaxial layer having a dopant concentration of $1\times10^{19}/cm^3$ or more; and a main surface of the silicon epitaxial wafer is tilted with respect to a [100] axis at an angle θ in a [011] direction or a [0-1-1] direction from a (100) plane and at an angle φ in a [01-1] direction or a [0-11] direction from the (100) plane, and the angle θ and the angle φ are less than ten minutes.

5. The bonded SOI wafer according to claim 4, wherein the dopant is phosphorus.

6. The bonded SOI wafer according to claim 3, wherein the dopant is phosphorus.

7. A bonded SOI wafer having at least a buried oxide film formed on a base wafer and an SOI layer formed on the buried oxide film, wherein the base wafer is a silicon epitaxial wafer having a silicon epitaxial layer grown by vapor phase epitaxy on a silicon single crystal substrate, the silicon epitaxial layer having a dopant concentration of $1\times10^{19}/cm^3$ or more; and a main surface of the silicon epitaxial wafer is tilted with respect to a [100] axis at an angle θ in a [011] direction or a [0-1-1] direction from a (100) plane and at an angle φ in a [01-1] direction or a [0-11] direction from the (100) plane, and the angle θ and the angle φ are less than ten minutes.

8. The bonded SOI wafer according to claim 7, wherein the dopant is phosphorus.

* * * * *